United States Patent [19]
Cain et al.

[11] Patent Number: 5,508,867
[45] Date of Patent: Apr. 16, 1996

[54] MAGNETORESISTIVE SENSOR WITH FLUX KEEPERED SPIN VALVE CONFIGURATION

[76] Inventors: William C. Cain, 5390 Landau Ct., San Jose, Calif. 95123; David E. Heim, 502 Grand St., Redwood City, Calif. 94062; Po-Kang Wang, 1007 Shadow Brook Dr., San Jose, Calif. 95120

[21] Appl. No.: 349,763

[22] Filed: Dec. 5, 1994

Related U.S. Application Data

[63] Continuation of Ser. No. 76,617, Jun. 11, 1993, abandoned.

[51] Int. Cl.$^6$ .................................................. G11B 5/127
[52] U.S. Cl. ........................ 360/113; 324/252; 338/32 R
[58] Field of Search ........................... 360/113; 324/252, 324/207.21; 338/32 R

[56] References Cited

U.S. PATENT DOCUMENTS

| | | | |
|---|---|---|---|
| 3,908,194 | 9/1975 | Romankiw | 360/113 |
| 4,755,897 | 7/1988 | Howard | 360/113 |
| 5,005,096 | 4/1991 | Krounbi et al. | 360/113 |
| 5,079,663 | 1/1992 | Ju et al. | 360/113 |
| 5,159,513 | 10/1992 | Dieny et al. | 360/113 |
| 5,206,590 | 4/1993 | Dieny et al. | 360/113 |
| 5,258,884 | 11/1993 | Howard et al. | 360/113 |
| 5,287,238 | 2/1994 | Baumgart et al. | 360/113 |

*Primary Examiner*—A. J. Heinz
*Assistant Examiner*—Brian E. Miller
*Attorney, Agent, or Firm*—Henry E. Otto, Jr.

[57] ABSTRACT

A magnetoresistive (MR) sensing system comprises an MR sensor with a layered spin valve structure including thin first and second layers of ferromagnetic material separated by a thin layer of nonmagnetic metallic material. The magnetization direction of the first layer at a zero applied magnetic field is substantially parallel to the longitudinal dimension of the MR sensor and substantially perpendicular to the fixed or "pinned" magnetization direction of the second layer. A thin keeper layer of ferromagnetic material is separated by a thin spacer layer from the layered spin valve structure. This keeper layer has a fixed magnetization direction substantially opposite that of the second layer and a moment-thickness product substantially equal to that of the second layer for cancelling the magnetostatic field from the second layer. A current flow is produced through the MR sensor to produce a magnetic field of a sign and magnitude which cancels the ferromagnetic exchange coupling between the first and second layers. Variations in resistivity of the MR sensor due to difference in rotation of the magnetizations in the first and second layers are sensed as a function of the magnetic field being sensed.

9 Claims, 4 Drawing Sheets

5,508,867

MAGNETORESISTIVE SENSOR WITH FLUX KEEPERED SPIN VALVE CONFIGURATION

This is a continuation of application Ser. No. 08/076,617 filed on Jun. 11, 1993 now abandoned.

FIELD OF THE INVENTION

This invention relates to high-performance magnetic random access disk drives, and more particularly to those comprising a magnetoresistive sensing system with a spin valve configuration.

BACKGROUND OF THE INVENTION

Commonly assigned U.S. Pat. No. 5,159,513 discloses a magnetoresistive (MR) sensor that utilizes the spin valve effect. The sensor comprises a rectangular multi-layered structure deposited on a glass or other suitable substrate. The multi-layered structure includes a "free" layer of soft magnetic material and a "pinned" layer in which the magnetization is fixed in a direction parallel to the width of the sensor by use of a hard magnetic material as the first layer or, if preferred, by use of an antiferromagnetic layer to pin the first layer by exchange coupling. The free and pinned layers are separated by a thin nonmagnetic metallic spacer layer, such as of copper. The magnetization of the free layer is normally in a direction along the length of the sensor, but is free to rotate therefrom in a positive or negative transition direction through an angle determined by the magnitude of the magnetic field being sensed.

In a spin valve structure, the change in resistance is proportional to the change in the angle between the directions of the magnetization in the two magnetic layers (i.e., the free layer and the pinned layer). The change in resistance of this multi-layered structure relative to a constant background value is then proportional to $\sin \theta$ averaged over the height of the sensor, where as heretofore indicated, $\theta$ is the angle of the magnetization in the free layer with respect to the longitudinal axis of the sensor. Because the resistance change is proportional to $\sin \theta$, the signal produced by the sensor will be linear throughout the applied field for small field values. However, the sensor output becomes nonlinear when the free layer is magnetically saturated during a positive or negative excursion of the applied field and thus limits the peak-to-peak signal that can be produced by the sensor.

The ideal quiescent magnetic state for the sensor is achieved when $\theta=0$ over the entire height of the free layer. This ideal quiescent state is that which is furthest from magnetic saturation under both positive and negative field excitations. It generates an ideal bias profile that maximizes the linear dynamic range to provide a larger signal output and/or improved linearity. However, this ideal bias profile cannot be achieved with spin valve structures disclosed in this cited patent or any other prior art known to applicants. This inability to obtain the ideal bias profile is due mainly to the flux coupling between the pinned layer and the free layer and by the field produced by the current that flows through and normal to the various layers of the spin valve structure. Attempts to balance out these undesirable effects by adjusting the current direction and placement of the spin valve structure in the gap resulted in a very nonuniform bias profile.

There is a need for a magnetic disk storage device having an MR sensor element with a spin valve structure in which the ferromagnetic exchange coupling and the field produced by the current are constant across the entire MR element so that their effects can be appropriately cancelled.

SUMMARY OF THE INVENTION

A magnetoresistive (MR) sensing system is described comprising an MR sensor with a layered spin valve structure including thin first and second layers of ferromagnetic material separated by a thin layer of nonmagnetic metallic material. The magnetization direction of the first layer at a zero applied magnetic field is substantially parallel to the longitudinal dimension of the MR sensor and substantially perpendicular to the fixed or "pinned" magnetization direction of the second layer.

A thin keeper layer of ferromagnetic material is separated by a thin spacer layer from the layered spin valve structure. This keeper layer has a fixed magnetization direction substantially opposite that of the second layer and a moment-thickness product substantially equal to that of the second layer for cancelling the magnetostatic field from the second layer. A current flow is produced through the MR sensor to produce a magnetic field of a sign and magnitude which cancels the ferromagnetic exchange coupling between the first and second layers. Variations in resistivity of the MR sensor due to difference in rotation of the magnetizations in the first and second layers are sensed as a function of the magnetic field being sensed.

If the first layer is between the keeper layer and the second layer, then the keeper layer may be of either a hard or soft ferromagnetic material. If the second layer is between the keeper layer and the first layer, then the keeper layer must be of a hard ferromagnetic material.

PRELIMINARY DESCRIPTION-PRIOR ART

Figure 1:
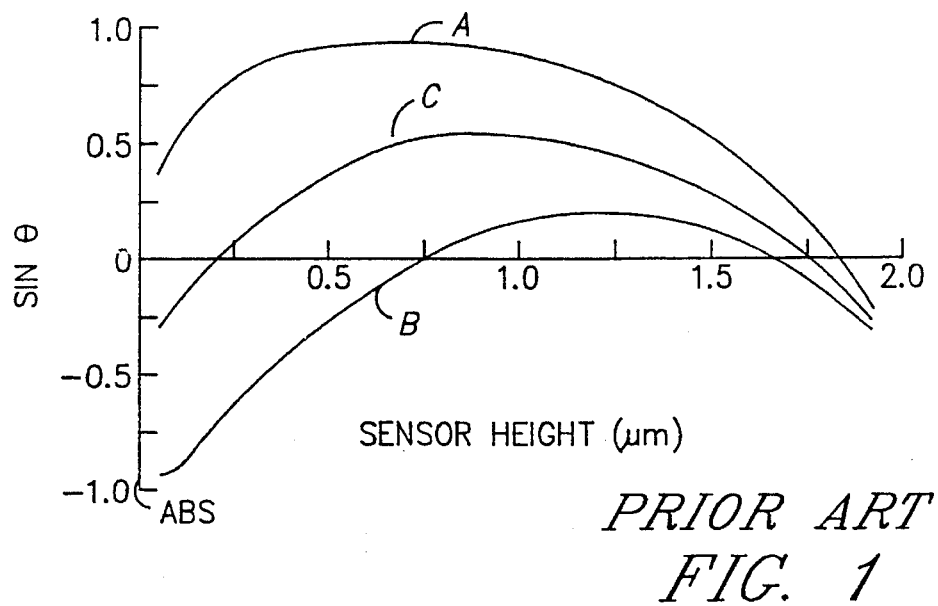
FIG. 1 depicts curves showing magnetization profiles of a prior art spin valve structure under a quiescent bias state and how this state changes as a result of positive and negative excitations from transitions on a magnetic storage disk.

FIG. 1 depicts magnetization profiles generated by magnetic read heads having a spin valve structure or configuration as taught by the cited prior art. It plots values of $\sin \theta$ against sensor height starting from the air bearing surface (ABS). Magnetization profiles A and B depict those generated during positive and negative excitations, respectively, during sensing of a magnetic transition on a disk; whereas the middle curve C represents the quiescent bias state and represents an optimal magnetic profile. Note that the free layer begins to saturate at a particular point for each polarity of excitation; i.e., where $\sin \theta = \pm 1$.

Figure 2:
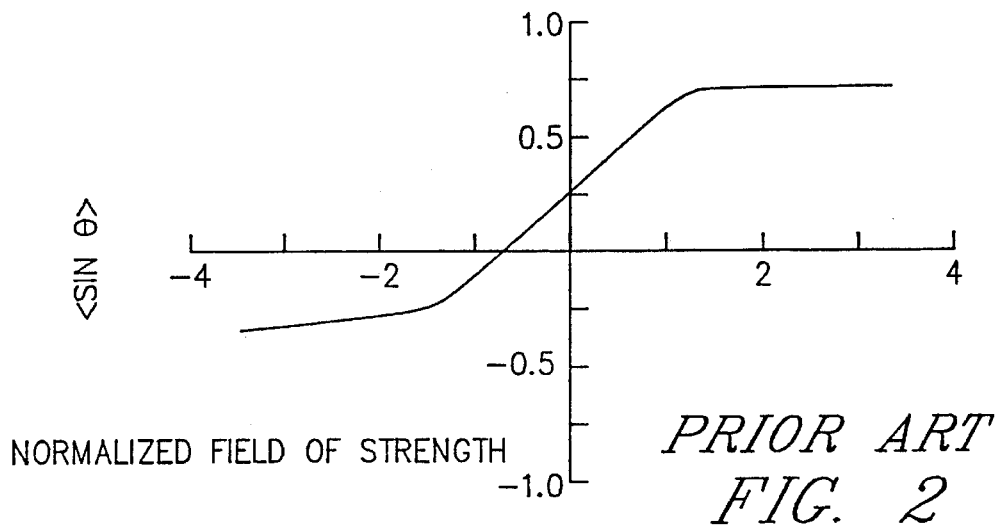
FIG. 2 depicts a transfer curve for the spin valve sensor of FIG. 1.

FIG. 2 is a transfer curve for the spin valve sensor of FIG. 1, in which changes in <sin θ>, the average of sin θ, are plotted against the magnetic field being sensed. This configuration provides a maximum peak-to-peak change in <sin θ> before onset of saturation of 0.77. Note that the curve becomes abruptly nonlinear at the onset of saturation, undesirably limiting the peak-to-peak signal available.

DESCRIPTION OF PREFERRED EMBODIMENTS

Figure 3:
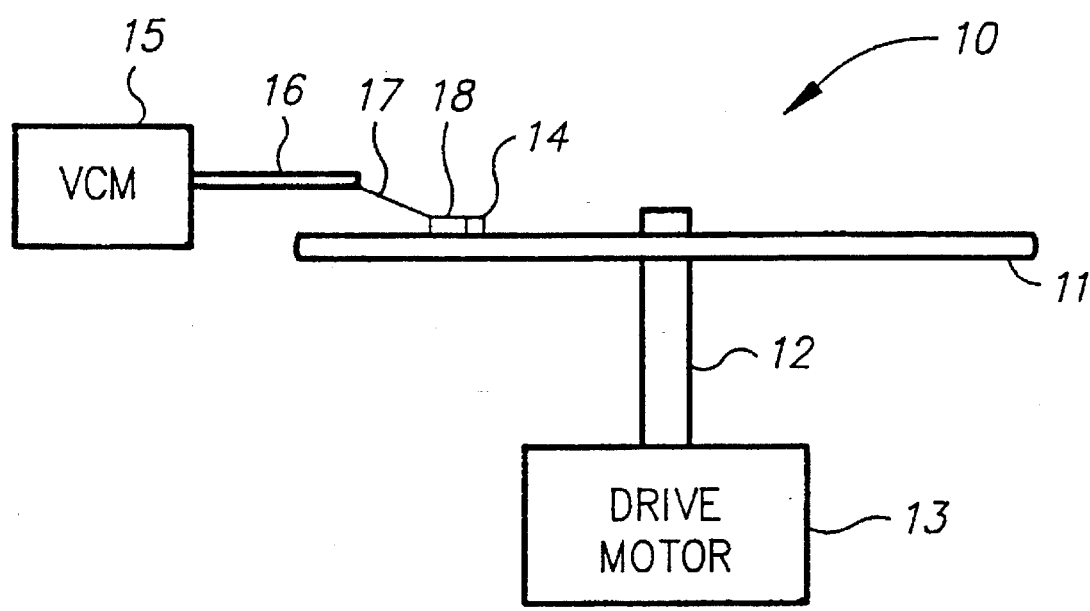
FIG. 3 depicts a random access magnetic disk storage device embodying the invention.

As illustrated in FIG. 3, a magnetic disk storage system 10 embodying the invention comprises a rotatable magnetic disk 11 supported on a spindle 12 and rotated by a disk drive motor 13. A composite magnetic inductive write/magnetoresistive read head 14 is movable relative to the disk by an actuator means for writing and reading magnetic data on tracks (not shown) on the disk. As illustrated, the actuator means comprises a voice coil motor 15 that acts through an actuator arm 16, a suspension 17, and a slider 18 to move the head 14 radially of the disk.

Figure 4:
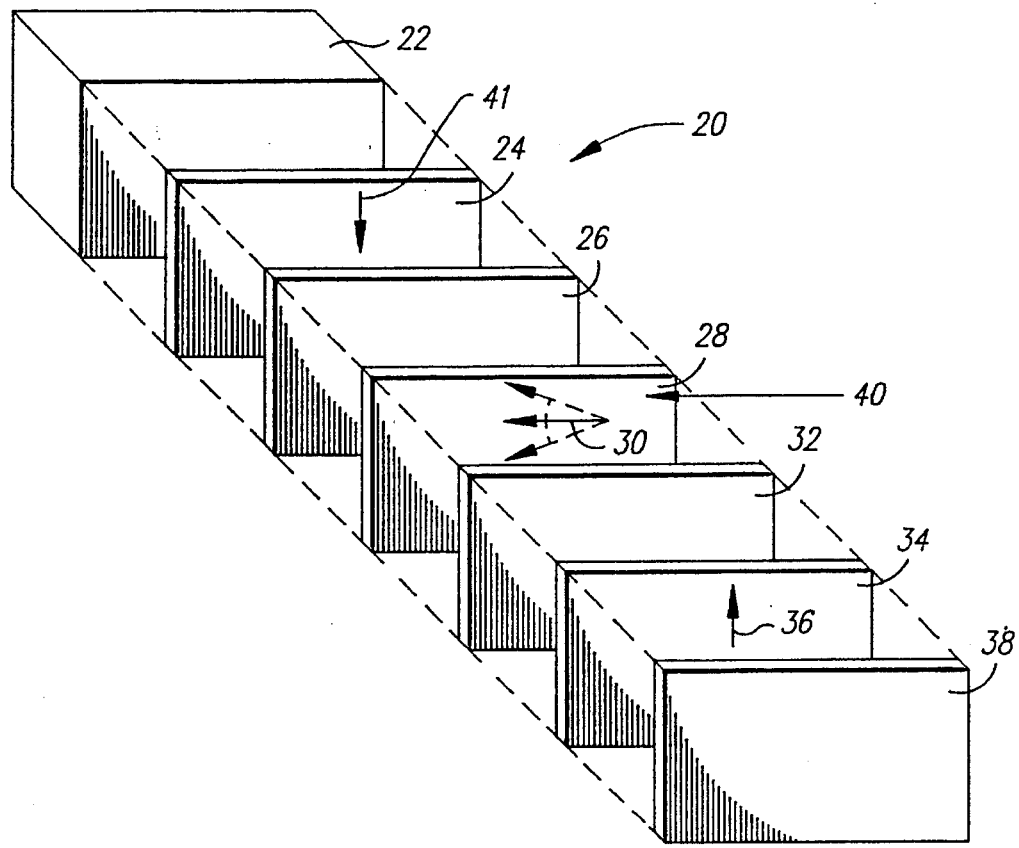
FIG. 4 is an exploded perspective view of one configuration of an MR sensor embodying the invention.

As illustrated in FIG. 4, composite head 14 comprises a rectangular magnetoresistive (MR) sensor element 20. According to the invention, MR sensor element 20 comprises a suitable substrate 22, such as glass, ceramic or a semiconductor material, upon which are deposited a flux keeper layer 24 of a hard (such as CoCr) or soft (such as NiFe) ferromagnetic material, a spacer layer 26 of a nonmagnetic material (such as Ta), and a "free" layer 28 of soft ferromagnetic material (such as NiFe). The easy axis of magnetization of layer 28 is along the length of the sensor element; i.e., in the direction of arrow 30. However, the direction of magnetization of layer 28 can rotate from its easy axis in a positive or a negative transition direction through an angle dependent upon the magnitude of the magnetic field being sensed.

A spacer layer 32 of a nonmagnetic metallic material, such as copper, separates free layer 28 from a "pinned" layer 34. The direction of magnetization of layer 34 is fixed (see arrow 36) to be parallel to the height (i.e., short) dimension of the sensor element 20, such as by exchange coupling with an antiferromagnetic layer 38. In such case, the coercivity of keeper layer 24 should be substantially equal to that of the pinned layer 34, as well as substantially higher than that of free layer 28. However, if preferred, layer 38 may be eliminated provided layer 34 is of a sufficiently hard magnetic material or has sufficiently high anisotropy to retain its magnetization during state switching operations. In this case, the coercivity of the keeper layer 24 should substantially equal that of the free layer 28 and be substantially less than that of pinned layer 34.

The sensor element 20, as thus far described, is substantially identical with that described in the above-cited patent except for the addition to the spin valve structure of the keeper layer 24 and spacer layer 26.

According to the invention, keeper layer 24 has a direction of magnetization which is opposite to that of the pinned layer 34. The magnetic moment-thickness product of the keeper layer is chosen to be substantially equal to that of the pinned layer thus providing an equal total magnetic moment for both the pinned layer 34 and the keeper layer 24. The magnetic moment of a material and its relationship to the magnetization of a layer of that material is described in greater detail in *The Foundations of Magnetic Recording*, second edition, John C. Mallinson, Academic Press, Chapter 1, 1993, which is incorporated herein by reference. Layer 24 acts as a magnetic keeper for the saturated pinned layer 34 and cancels the magnetostatic field from the pinned layer.

The ferromagnetic exchange coupling between free layer 28 and pinned layer 34 acts on the free layer as an effective field in the same direction as the magnetization in the pinned layer.

The sign of the current from a current source 48 (FIG. 5) is chosen to produce a field in the free layer 28 which cancels this exchange field. Thus, as illustrated, the current must be in the direction of arrow 40 so that its field acting on free layer 28 is opposite to the direction of the effective ferromagnetic exchange field. The magnitude of the field from the current depends upon the magnitude of the current and the placement of the sensor element 20 in the gap between conventional magnetic shields (not shown) that minimize the effects of stray magnetic flux that would decrease the resolution of the read back signal. The current magnitude and position of the sensor element can be adjusted in combination to produce the desired degree of cancellation of the effective exchange field.

With the magnetostatic field from the pinned layer 34 cancelled by keeper layer 24, and the ferromagnetic exchange and sense current fields also cancelled, free layer 28 will have no effective bias field acting on it. Free layer 28 will therefore achieve a uniform, unbiased (i.e., substantially zero angle bias) state. As a result, the sensor element 20 can be driven with larger excitations from magnetic disk 11 before magnetic saturation, and thereby provide a larger peak-to-peak signal than is possible with prior known MR sensors.

With a sensor element 20 of the type illustrated in FIG. 4, wherein the keeper layer 24 is adjacent to substrate 22, the keeper layer may, as earlier noted, be of either a soft or a hard ferromagnetic material. The field from a current in the direction of arrow 40 will cause a keeper layer of soft magnetic material to be saturated in a flux closed configuration with pinned layer 34; whereas if the keeper layer is of a hard magnetic material, it must have a direction of magnetization opposite to that of the pinned layer, as shown by arrow 41 in FIG. 4.

Figure 5:
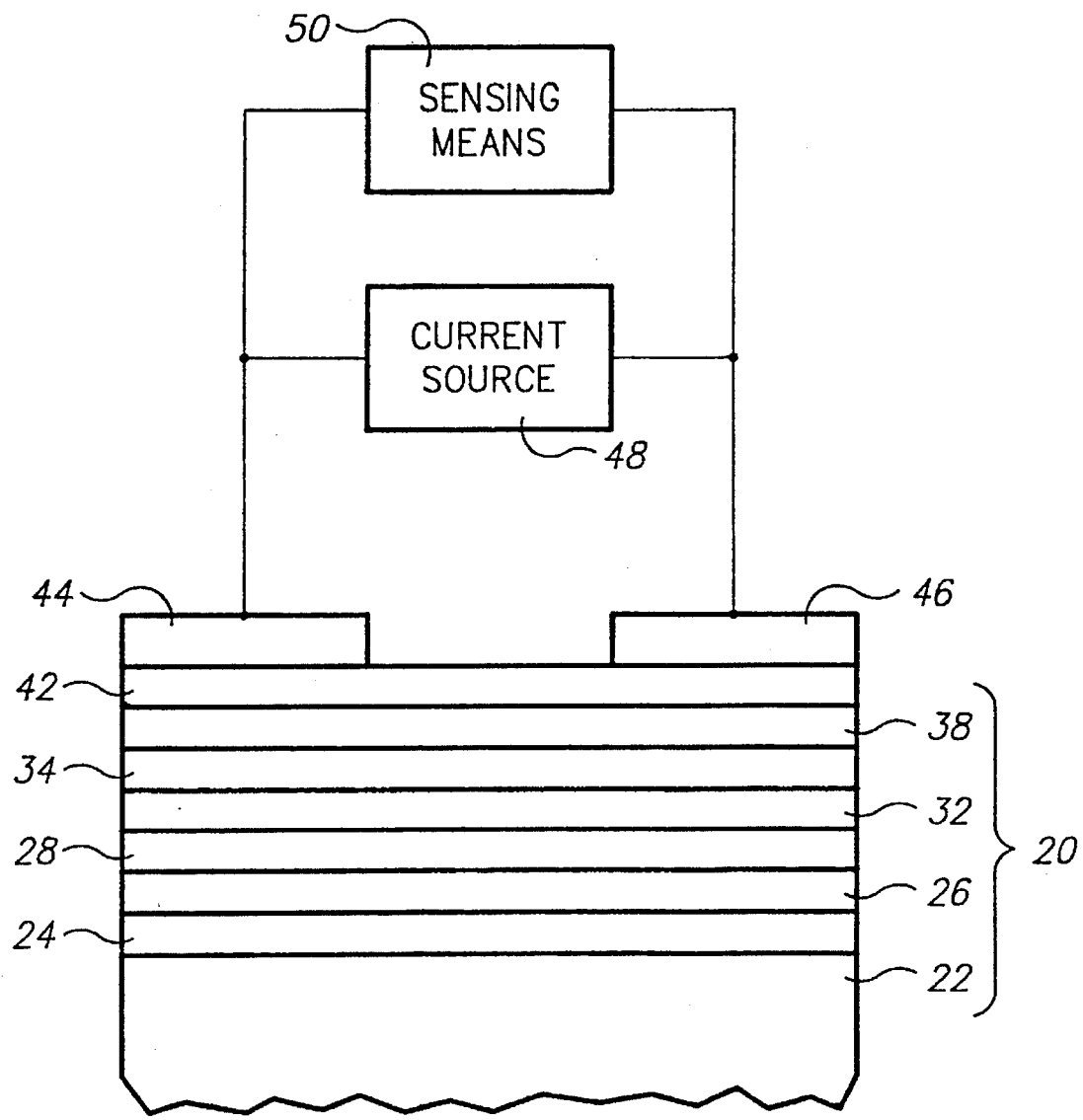
FIG. 5 is a schematic diagram of an MR sensory system including the MR sensor of FIG. 4.

As shown in FIG. 5, a capping layer 42 of a high resistivity material, such as Ta, is deposited over antiferromagnetic layer 38 of MR sensor element 20. Then electrical leads 44, 46 are provided on layer 42 to form a circuit path between the MR sensor element 20, current source 48 and sensing means 50.

Source 48 produces a current flow through the MR sensor element 20 to generate a magnetic field of a size and magnitude which cancels the ferromagnetic exchange coupling between the free layer 28 and pinned layer 34. Sensing means 50 senses variations in resistivity of the MR sensor element 20 due to differences in rotation of the magnetizations in the free and pinned layers 28, 34, respectively, as a function of the magnetic field being sensed.

Figure 6:
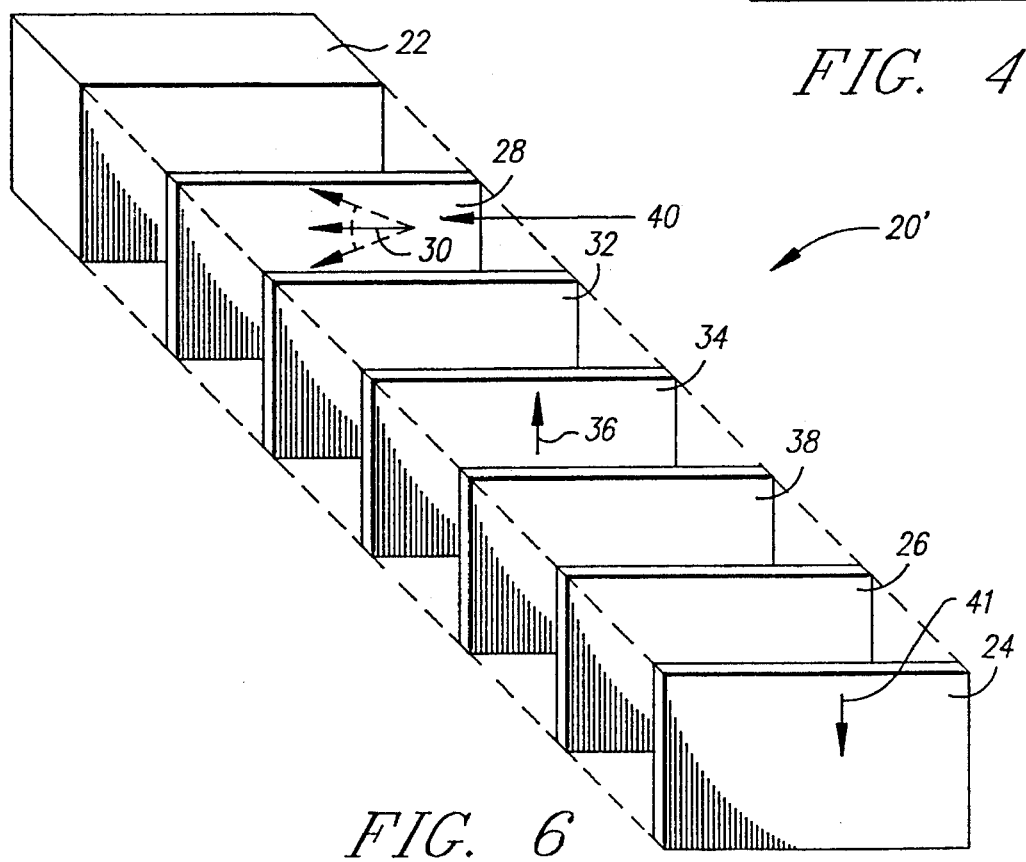
FIG. 6 is an exploded perspective view of an alternative configuration of an MR sensor embodying the invention.

According to an alternative embodiment of the invention and as illustrated in FIG. 6, in sensor element 20', keeper layer 24 and spacer layer 26 are positioned remote from (instead of adjacent) the substrate 22. In such event, since a current in the direction of arrow 40 will produce a field in keeper layer 24 whose direction is the same as the direction of magnetization of pinned layer 34, keeper layer 24 must be of a magnetically hard material, such as CoCr, having a coercivity substantially equal to that of pinned layer 34 or of a material with high anisotropy or otherwise suitably pinned in order to retain its magnetization in the opposite direction to oppose this field. With this embodiment, capping layer 42 will be interposed between keeper layer 24 and leads 44, 46.

Figure 7:
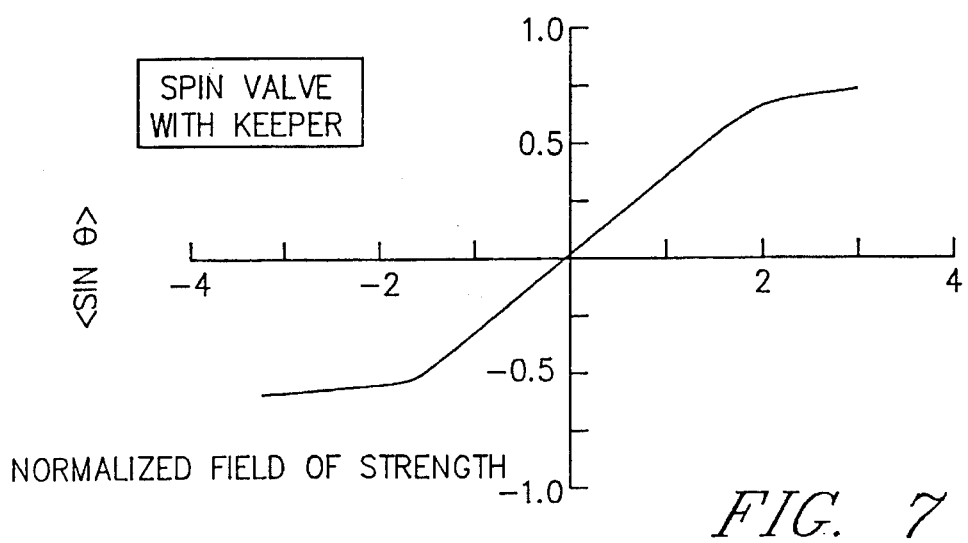
FIG. 7 depicts a transfer curve for a spin valve sensor constructed according to the invention.

FIG. 7 depicts a transfer curve for an MR sensor element having a spin valve structure according to either of the above described embodiments of the invention. This curve plots <sin θ> (the average of sin θ) against the magnetic field being sensed and shows that the maximum peak-to-peak signal change in <sin θ> has improved to 1.02 from the 0.77 which is shown in FIG. 2 and represents that of the prior art. It has been established that an average sin θ=1 is substantially the best achievable at the air bearing surface (ABS) of the disk with a shielded spin valve sensor.

While, for sake of simplification, the invention has been illustrated as embodied in a magnetic disk storage system with a single disk, it will be apparent that the invention may, and generally will, be embodied in such a system comprising a plurality of disks, actuators, and sliders, as known in the prior art.

Also, while the invention has been particularly shown and described with reference to preferred embodiments thereof, it will be understood by those skilled in the art that various changes in form and detail may be made in these embodiments without departing from the spirit and scope of the invention. Hence, the invention is not to be deemed limited except as required by the claims.

We claim:

1. A magnetoresistive (MR) sensing system comprising:

an MR sensor comprising a layered spin valve structure including first and second layers of ferromagnetic material separated by a layer of nonmagnetic metallic conductive material, the magnetization direction of said first layer at a zero applied magnetic field being substantially parallel to the longitudinal axis of the MR sensor and substantially perpendicular to a fixed magnetization direction of said second layer, and a keeper layer of ferromagnetic material separated from the layered spin valve structure by a spacer layer of high resistivity material, said keeper layer having a fixed magnetization direction substantially opposite that of said second layer and a magnetic moment thickness product substantially equal to that of said second layer for cancelling a magnetostatic field from the second layer;

means for producing a current flow through the MR sensor to produce a magnetic field having a direction and magnitude which cancels a magnetic field generated by ferromagnetic exchange coupling between said first and second layers; and means for sensing variations in resistivity of the MR sensor due to the difference in rotation of the magnetizations in said first and second layers as a function of the magnetic field being sensed.

2. The sensing system of claim 1, wherein the MR sensor comprises a substrate and the keeper layer has a coercivity substantially equal to that of said second layer and substantially higher than that of said first layer and is disposed between the substrate and first layer.

3. The sensing system of claim 1, wherein the MR sensor comprises a substrate and the keeper layer has a coercivity substantially equal to that of said first layer and substantially less than that of said second layer and is disposed between the substrate and first layer.

4. The sensing system of claim 1, wherein the second layer is between the first layer and keeper layer, and the keeper layer is of a magnetic material having a coercivity substantially equal to that of the second layer.

5. A magnetoresistive (MR) sensor comprising:

a layered spin valve structure including first and second layers of ferromagnetic material separated by a layer of nonmagnetic metallic conductive material, the magnetization direction of said first layer at a zero applied magnetic field being substantially parallel to the longitudinal axis of the MR sensor and substantially perpendicular to a fixed magnetization direction of said second layer;

a spacer layer of nonmagnetic high resistivity material; and a keeper layer of ferromagnetic material separated by the nonmagnetic spacer layer from the layered spin valve structure and having a fixed magnetization direction substantially opposite that of said second layer and a magnetic moment thickness product substantially equal to that of said second layer for cancelling a magnetostatic field from the second layer.

6. The sensor of claim 5, including a substrate, and wherein the keeper layer has a coercivity substantially equal to that of said second layer and substantially higher than that of said first layer and is disposed between the substrate and first layer.

7. The sensor of claim 5, including a substrate, and wherein the keeper layer has a coercivity substantially equal to that of said first layer and substantially less than that of said second layer and is disposed between the substrate and first layer.

8. The sensor of claim 5, wherein the second layer is between the first layer and keeper layer, and the keeper layer is of a magnetic material having a coercivity substantially equal to that of the second layer.

9. A magnetic storage device comprising:

at least one rotatable magnetic recording disk onto which data can be written and from which data can be read;

at least one magnetic transducer associated with each disk, each transducer comprising a magnetoresistive (MR) sensor, each MR sensor comprising:

a layered spin valve structure including first and second layers of ferromagnetic material separated by a layer of nonmagnetic metallic conductive material, the magnetization direction of said first layer at a zero applied magnetic field being parallel to the longitudinal axis of the MR sensor and substantially perpendicular to a fixed magnetization direction of said second layer, and a keeper layer of ferromagnetic material separated from the layered spin valve structure by a spacer layer of high resistivity nonmagnetic material, said keeper layer having a fixed magnetization direction substantially opposite that of said second layer and a magnetic moment thickness product substantially equal to that of said second layer for cancelling a magnetostatic field from the second layer;

actuator means coupled to the magnetic transducer(s) for moving the transducer(s) relative to the disk(s) during rotation of the disk(s);

means for producing a current flow through a selected MR sensor to produce a magnetic field having a direction and magnitude which cancels a magnetic field generated by ferromagnetic exchange coupling between the first and second layers of that selected sensor; and means for sensing from data read from an associated disk variations in resistivity of the selected MR sensor due to the difference in rotation of the magnetizations in said first and second layers as a function of the magnetic field being sensed.

* * * * *

UNITED STATES PATENT AND TRADEMARK OFFICE
CERTIFICATE OF CORRECTION

PATENT NO. : 5,508,867
DATED : April 16, 1996
INVENTOR(S) : William C. Cain, et al It is certified that error appears in the above-identified patent and that said Letters Patent is hereby corrected as shown below:

On the title page insert item --[73] International Business Machines Corporation Armonk, New York--

Signed and Sealed this

Twentieth Day of July, 1999

Attest:

Q. TODD DICKINSON

*Attesting Officer*   Acting Commissioner of Patents and Trademarks